(12) United States Patent
Osada

(10) Patent No.: US 7,969,027 B2
(45) Date of Patent: Jun. 28, 2011

(54) SEMICONDUCTOR DEVICE ENCAPSULATED WITH RESIN COMPOSITION

(75) Inventor: Shoichi Osada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 724 days.

(21) Appl. No.: 11/806,184

(22) Filed: May 30, 2007

(65) Prior Publication Data

US 2007/0281164 A1    Dec. 6, 2007

(30) Foreign Application Priority Data

May 31, 2006 (JP) ................................ 2006-152568

(51) Int. Cl.
| | |
|---|---|
| H01L 23/29 | (2006.01) |
| H01L 23/28 | (2006.01) |
| H01L 23/31 | (2006.01) |
| B32B 27/04 | (2006.01) |
| B32B 27/20 | (2006.01) |
| B32B 27/38 | (2006.01) |
| C08K 3/34 | (2006.01) |
| C08K 3/36 | (2006.01) |
| C08L 63/00 | (2006.01) |

(52) U.S. Cl. ........ 257/789; 257/788; 257/793; 257/795; 428/413; 523/440; 523/443; 523/466

(58) Field of Classification Search ......................... None
See application file for complete search history.

(56) References Cited

U.S. PATENT DOCUMENTS

| | | | |
|---|---|---|---|
| 6,221,509 B1 | 4/2001 | Hirano et al. | |
| 6,231,997 B1 * | 5/2001 | Arai et al. ..................... | 428/620 |
| 6,291,899 B1 * | 9/2001 | Wensel et al. ................. | 257/787 |
| 6,696,748 B1 * | 2/2004 | Thurgood .................... | 257/668 |

FOREIGN PATENT DOCUMENTS

| | | |
|---|---|---|
| EP | 1 595 919 A1 | 11/2005 |
| JP | 5-267371 A | 10/1993 |
| JP | 11-302506 A | 11/1999 |
| JP | 2001-172472 A | 6/2001 |
| JP | 2004-118511 A | 4/2004 |
| JP | 2004-203983 A | 7/2004 |
| JP | 2005-325209 A | 11/2005 |

* cited by examiner

Primary Examiner — Michael J Feely
(74) Attorney, Agent, or Firm — Birch, Stewart, Kolasch & Birch, LLP

(57) ABSTRACT

A semiconductor device comprising an organic substrate, at least one semiconductor chip provided on a surface of the substrate, and a cured resin composition encapsulating the semiconductor chip provided on the surface of the substrate, characterized in that an absolute value of a distance between an imaginary line connecting two diagonally opposite corners of the substrate and a highest or lowest position on the surface of the substrate between the corners is smaller than 600 µm, as measured with a laser three-dimensional measuring instrument, a total volume ratio of the semiconductor chip to the semiconductor device ranges from 18 to 50%, and the cured resin composition comprises an inorganic filler (C) in such an amount that a weight ratio of the inorganic filler (C) to a total weight of the cured resin composition ranges from 80 to 90%.

12 Claims, 1 Drawing Sheet

US 7,969,027 B2

SEMICONDUCTOR DEVICE ENCAPSULATED WITH RESIN COMPOSITION

CROSS REFERENCE

This application claims benefit of the Japanese Patent application No. 2006-152568 filed on May 31, 2006, the contents of which are hereby incorporated by reference.

FIELD OF THE INVENTION

The present invention related to a semiconductor device encapsulated with a resin composition. The semiconductor device comprises a substrate which is little bent or warped. The device is resistant to heat imposed in a solder reflow process. The present invention also relates to an epoxy resin composition suitable for preparing the semiconductor device.

BACKGROUND OF THE INVENTION

Ball Grid Array (BGA) package is widely used which is an encapsulated IC chips mounted on an organic substrate via solder ball array. As the organic substrate, mono- or multi-layers of glass cloth or nonwoven fabric cloth impregnated with an epoxy resin are widely used. In the BGA package, the substrate tends to bend or warp due to difference in volume of encapsulation resin between the topside, where the IC chips are mounted, and the backside of the package. Previously, warpage was mostly concave due to shrinkage associated with curing of the resin. To prevent the concave warpage, a large amount of inorganic filler is added to the resin to suppress the shrinkage, as described in Japanese Patent Application Laid-Open No. 5-267371.

Recently, a volume of an encapsulation resin is decreasing to meet the need for thinner packages. In these packages, the substrate tends to warp convexly, contrary to the aforesaid concave warpage. Particularly, the Chip on Board Ball Grid Array package tends to show convex warpage caused by grooves on the backside to be filled with the resin. To prevent the convex warpage, one may reduce an amount of inorganic filler. However, this may degrade moisture resistance of the encapsulated device. Alternatively, one may use inorganic filler having relatively large coefficient of thermal expansion. A known example of such a filler is spherical cristobalite having an average thermal expansion coefficient of $2.0 \times 10^{-5}/°$ C. at a temperature of from 40 to 400° C. Compositions comprising the cristobalite are also known from Japanese Patent Application Laid-Open No. 11-302506 and No. 2001-172472. It should be noted that cristobalite exhibits drastic increase in thermal expansion coefficient associated with a phase transition from $\alpha$-phase to $\beta$-phase at 268° C. This causes problems of, for example, separation at an interface between the substrate and the cured resin and a big warpage of the substrate in a reflow process at a maximum temperature of 265° C.

SUMMARY OF THE INVENTION

An object of the present invention is to provide an encapsulated semiconductor device of which substrate is little warped and is resistant to heat imposed in a solder reflow process.

Another object of the present invention is to provide a resin composition suitable for preparing the semiconductor device.

The present invention is a semiconductor device comprising an organic substrate, at least one semiconductor chip provided on a surface of the substrate, and a cured resin composition encapsulating the semiconductor chip provided on the surface of the substrate, characterized in that an absolute value of a distance between an imaginary line connecting two diagonally opposite corners of the substrate and a highest or lowest position on the surface of the substrate between the corners is smaller than 600 µm, as measured with a laser three-dimensional measuring instrument, a total volume ratio of the semiconductor chip to the semiconductor device ranges from 18 to 50%, and the cured resin composition comprises an inorganic filler (C) in such an amount that a weight ratio of the inorganic filler (C) to a total weight of the cured resin composition ranges from 80 to 90%.

Another aspect of the present invention is a resin composition for encapsulating a semiconductor device comprising
 (A) an epoxy resin,
 (B) a curing agent having an epoxy-reactive group in such an amount that a molar ratio of the epoxy-reactive group to the epoxy group of the component (A) ranges from 0.5 to 1.5,
 (C) an inorganic filler and
 (D) a curing promoter, characterized in that the inorganic filler (C) comprises
  (C1) at least one inorganic filler having an average thermal expansion coefficient of from $1.0 \times 10^{-5}/°$ C. to $3.0 \times 10^{-5}/°$ C. at a temperature of from 40 to 400° C. and
  (C2) at least one inorganic filler having an average thermal expansion coefficient smaller than $1.0 \times 10^{-5}/°$ C. at a temperature of from 40 to 400° C.,
 a weight ratio of the inorganic filler (C) to the cured resin composition ranges from 80 to 90%, and
 a weight ratio of the inorganic filler (C1) to the cured resin composition ranges from 5 to 45%.

The aforesaid semiconductor device of the present invention comprises a substrate little warped. The device is not cracked or peeled off by heat imposed in a reflow process at a maximum temperature of 265° C. The composition of the present invention can form the semiconductor device without warping its substrate.

PREFERRED EMBODIMENTS OF THE INVENTION

Figure 1:
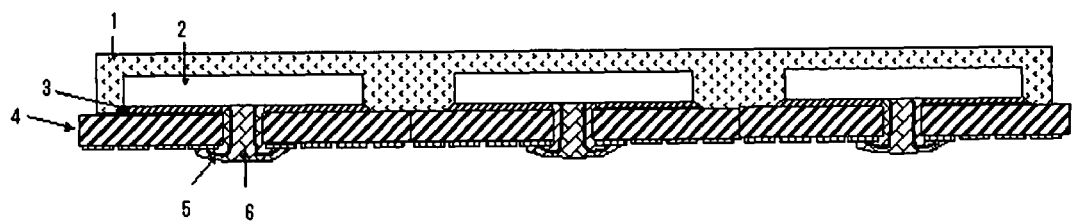
FIG. 1 is a cross sectional view of an exemplary Tip on Board Ball Grid Array package.

The semiconductor device of the present invention will be explained with reference to FIG. 1 which is a cross sectional view of an embodiment of a Chip on Board Ball Grid Array package. In FIG. 1, the semiconductor device comprises an organic substrate 4, a semiconductor element or chip such as IC chip bonded to the substrate 4 with a layer of cured die-bonding agent 3. The organic substrate 4 is connected to the semiconductor element or chip 2 with a bonding wire 5. The substrate 4 and the chip 2 are encapsulated with a cured resin composition 1. The semiconductor device has a groove filled with the cured resin composition 6. The bonding wire 5 is encapsulated with the cured resin composition 6. As the die-bonding agent, any known agent can be used such as an epoxy resin type, a silicone resin type, or a polyimide rein type. The die-bonding agent layer preferably has a thickness of from 30 to 80 μm for the purpose of high resistance to reflow process and heat cycle, good handling property, and smaller warpage of a semiconductor device. The organic substrate 4 may be a commonly used one such as a FR-4 board made from an epoxy resin or a bismaleimide triazine (BT) board. On a surface of the substrate, a solder resist layer may be formed for the purpose of protecting copper wirings. The substrate 4 typically has a thickness of from 0.1 to 0.4 mm.

Figure 2:
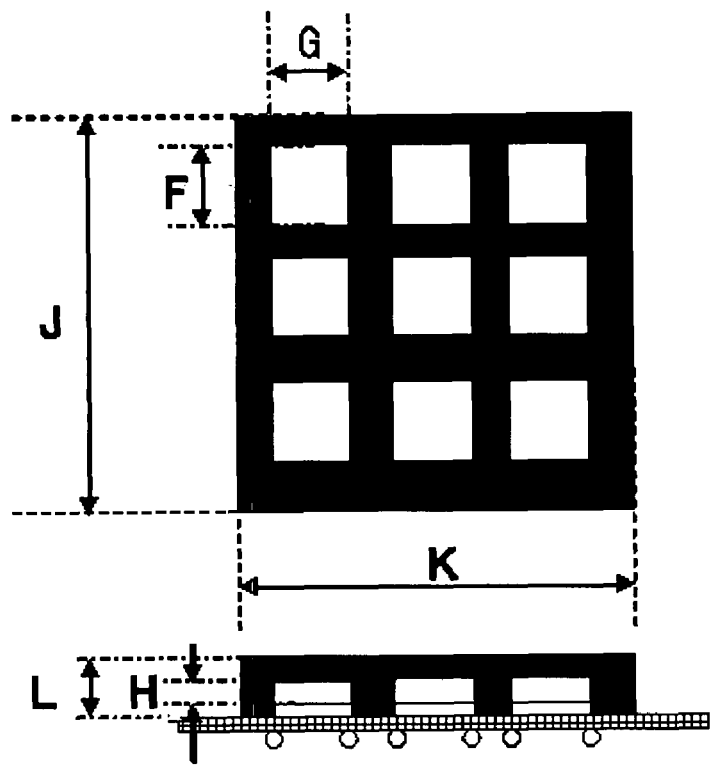
FIG. 2 is a plan view with a cross sectional view of the Tip on Board Ball Grid Array package prepared in the Examples, indicating the sizes used in the calculation of the volumes.

In the semiconductor device of the present invention, a ratio of a total volume of semiconductor chips to a total volume of the semiconductor device ranges from 18 to 50%, preferably from 20 to 45%. As shown in FIG. 2, the total volume of the semiconductor device can be calculated as J×K×L (mm$^3$) and the total volume of the semiconductor chips as a product of F×G×H (mm$^3$) multiplied by a number of the chips(N). A semiconductor device having the volume ratio smaller than the aforesaid lower limit tends to concavely warp, whereas the one with the ratio higher than the aforesaid upper limit tends to convexly warp. The total volume of the semiconductor device can be approximated by an internal volume of a mold used for resin encapsulation, although there is a little shrinkage associated with curing. In an actual semiconductor device, particularly, a Chip on Board Ball Grid Array package as shown in FIG. 1, cured resin exists on the backside, too. However, its volume is practically negligibly small compared with a volume of the resin on topside.

The organic substrate 4 and the semiconductor chip 2 are encapsulated with a cured resin composition 1 and 6. The cured resin composition, hereinafter may be referred to as "cured resin", comprises a resin component such as a novolac epoxy type resin, a cresol novolac epoxy type resin, or a bisphenol A epoxy type resin cured with a curing agent such as a phenolic resin.

The cured resin further comprises an inorganic filler (C) in such an amount that a weight ratio of the inorganic filler (C) to the cured resin, hereinafter referred to as "(C) wt %" of from 80 to 90%. The (C) wt % can be determined as an ash content of the cured resin measured with a thermogravimetric analyzer by raising temperature to about 600° C. in the air. A cured resin having a (C) wt % less than the aforesaid lower limit tends to be hygroscopic, and a semiconductor device encapsulated with such a cured resin may have poor reflow resistance. On the other hand, a semiconductor device encapsulated with a cured resin having a (C) wt % more than the aforesaid upper limit may be warped largely.

Preferably, the inorganic filler (C) comprises at least one spherical filler. A shape of the filler can be observed with a microscope. More preferably, the inorganic filler (C) comprises at least one filler composed of silicon dioxide. Silicon dioxide can be identified by elemental analysis.

The semiconductor device of the present invention is characterized by an absolute value of amount of warpage, as measured with a laser three-dimensional measuring instrument, smaller than 600 μm, preferably at most 500 μm. The amount of warpage is measured as a distance between an imaginary line connecting two diagonally opposite corners of the substrate and a highest or lowest position on the surface of the substrate between the two corners. A negative distance means concave warpage and a positive one means convex warpage. A warpage outside the aforesaid range may cause problems, for example, troubles in transporting semiconductor devices with an automatic carrier device; difficulties in fixing the semiconductor device in a segmenting process of the semiconductor device; and failure in soldering the segmented device on a wiring board.

The present invention also provides a resin composition suitable for forming the encapsulating cured resin in the aforesaid semiconductor device. The resin composition comprises:

(A) an epoxy resin;
(B) a curing agent having an epoxy-reactive group in such an amount that a molar ratio of the epoxy-reactive group to the epoxy group of the component (A) ranges from 0.5 to 1.5;
(C) an inorganic filler; and
(D) a curing promoter.

Examples of the epoxy resin (A) include novolac type epoxy resin, cresol novolac epoxy resin, triphenolalkane epoxy resin, aralykyl epoxy resin, biphenyl backbone-containing aralykyl type epoxy resin, biphenyl type epoxy resin, dicyclopentadiene type epoxy resin, heterocyclic epoxy resin, naphthalene ring-containing epoxy resin, bisphenol A type epoxy resin, bisphenol F type epoxy resin, bisphenol S type epoxy compound, stilbene type epoxy resin and a mixture thereof.

Preferably, the epoxy resin (A) has a hydrolyzable chlorine content of at most 1,000 ppm, particularly, at most 500 ppm, a sodium content of at most 10 ppm, and a potassium content of at most 10 ppm. An epoxy resin having a hydrolyzable chlorine, sodium, or potassium content more than the aforesaid amount may damage a semiconductor device encapsulated with the epoxy resin with chlorine or alkaline metal ions liberated from the epoxy resin when the device is exposed to high temperature and humidity.

The curing agent (B) has a functional group reactive with an epoxy resin (A). Preferably, a phenolic resin is used such as phenol novolac resin, naphthalene ring-containing phenolic resin, aralykyl type phenolic resin, triphenolalkane type phenolic resin, biphenyl backbone-containing aralykyl type phenolic resin, biphenyl type phenolic resin, alicyclic phenolic resin, heterocyclic phenolic resin, naphthalene ring-containing phenolic resin, bisphenol A type phenolic resin, bisphenol F type phenolic resin, and a mixture thereof. Preferably, the curing agent has a sodium content of at most 10 ppm and a potassium content of at most 10 ppm from the same reason as mentioned above concerning the epoxy resin (A).

In the composition, the component (B) is contained in such an amount that a molar ratio of its epoxy-reactive group to the epoxy group in the component (A) ranges from 0.5 to 1.5, preferably from 0.8 to 1.2.

The inorganic filler (C) comprises at least one inorganic filler having an average thermal expansion coefficient of from $1.0 \times 10^{-5}/°$ C. to $3.0 \times 10^{-5}/°$ C. at a temperature of from 40 to 400° C. (C1) and at least one inorganic filler having an average thermal expansion coefficient smaller than $1.0 \times 10^{-5}/°$ C. at a temperature of from 40 to 400° C. (C2). A total amount of the inorganic filler (C) is such that a weight ratio of the inorganic filler (C) to the cured resin ranges from 80 to 90%. The inorganic filler (C1) is contained in such an amount that a weight ratio of the inorganic filler (C1) to the cured resin composition ranges from 5 to 45%. With the inorganic filler (C1) less than the aforesaid lower limit, a thermal expansion coefficient of a cured resin may be too small to prevent warping of a substrate. On the other hand, the inorganic filler (C1), particularly amorphous filler, in an amount above the aforesaid upper limit may decrease flowability of a composition, causing breakage of wire bonds, formation of voids, or other molding deficiency in the molding process. As described above, there is a phase transition in cristobalite. However, the transition does not cause any problem, if the content of cristobalite is in the aforesaid range. If the component (C) is contained less than the aforesaid lower limit, a cured resin may be more hygroscopic, and reflow resistance of an encapsulated semiconductor device may be worse. On the other hand, the component (C) more than the aforesaid upper limit may cause an encapsulated semiconductor device to warp as described above.

An average thermal expansion coefficient can be determined with a thermal dilatometer. When two or more fillers are contained in the component (C1) and/or the component (C2), an average thermal expansion coefficient is determined as a sum of products of an average thermal expansion coefficient of each filler multiplied by the filler's volume fraction. The volume fraction here is a theoretical volume fraction, i.e., a ratio of a theoretical volume of a filler, calculated by dividing a weight of a filler by its specific gravity, to a total of theoretical volumes of the fillers.

The composition comprising the aforesaid fillers each having specific thermal expansion of coefficient can form a cured resin having a desired volume % of the fillers to give a semiconductor device with little warpage. That is, a ratio of [a theoretical volume of the inorganic filler (C1)+a theoretical volume of the inorganic filler (C2)] to [a theoretical volume of the cured resin] ranges from 70 to 80%, preferably from 72 to 77%, and a ratio of [a theoretical volume of the inorganic filler (C1)] to [a theoretical volume of the cured resin] ranges from 6 to 40%, preferably from 7 to 30%. The theoretical volume of the inorganic filler (C1) is calculated by dividing a weight of the inorganic filler (C1) by a specific gravity of the filler at 25° C., c1 (g/cm$^3$); and the theoretical volume of the inorganic filler (C2) is calculated by dividing a weight of the inorganic filler (C2) by a specific gravity of the filler at 25° C., c2 (g/cm$^3$). The theoretical volume of the cured resin is calculated by dividing a weight of a predetermined amount of about 10 g of the resin composition cured at a temperature of 175° C. and a pressure of 6.9 MPa for 120 seconds by a specific gravity, e(g/cm$^3$), of the resin composition calculated according to the Japanese Industrial Standards (JIS) K 6911.

A cured resin composition prepared from the composition of the present invention has a thermal expansion coefficient of from $1.4 \times 10^{-5}$/° C. to $1.8 \times 10^{-5}$/° C., preferably from $1.4 \times 10^{-5}$/° C. to $1.7 \times 10^{-5}$/° C. at its glass transition temperature (Tg) or lower. At a temperature higher than Tg, the cured resin composition has a thermal expansion coefficient of from $4.2 \times 10^{-5}$/° C. to $6.8 \times 10^{-5}$/° C. Being encapsulated with the cured resin with these thermal expansion coefficients, a semiconductor device has little warpage. A method of measuring a thermal expansion coefficient will be explained in the Examples.

The inorganic filler (C1) preferably has an average thermal expansion coefficient of from $1.4 \times 10^{-5}$/° C. to $2.5 \times 10^{-5}$/° C. at a temperature of from 40 to 400° C. Examples of the inorganic filler (C1) include lithium silicate(1.2 to $1.3 \times 10^{-5}$/° C.), cristobalite($2.0 \times 10^{-5}$/° C.), quartz(crystalline silica, $1.5 \times 10^{-5}$/° C.), tridymite($1.2 \times 10^{-5}$/° C.), monticellite($1.1 \times 10^{-5}$/° C.) and a mixture thereof, among which cristobalite, particularly spherical cristobalite, is more preferred.

The inorganic filler (C2) has an average thermal expansion coefficient smaller than $1.0 \times 10^{-5}$/° C., and preferably is spherical to attain high packing density. Examples of the inorganic filler (C2) include fused silica, talc, alumina, magnesium oxide, among which spherical fused silica($0.05 \times 10^{-5}$/° C.) is preferred because of good molding property.

Preferably, the aforesaid inorganic filler (C1) and (C2) are treated with a coupling agent such as a silane coupling agent or a titanate coupling agent to improve dispersibility and wettability in resins by capping reactive functional groups on filler surface. Examples of the coupling agent include epoxysilanes such as γ-glycidoxypropylmethoxysilane, γ-glycidoxypropylmethyldiethoxysilane, and β-(3,4-epoxycyclohexyl)ethyltrimethoxysilane; aminosilane such as N-β (aminoethyl)-γ-aminopropylmethoxysilane, a reaction product of imidazol with γ-glycidoxypropyltrimethoxysilane, γ-aminopropyltriethoxysilan, and N-phenyl-γ-aminopropyltrimethoxysilane; mercaptosilanes such as γ-mercaptosilane, and γ-episulfidoxypropyltrimethoxysilane silane coupling agent. Any known method of surface treatment can be used and an amount of the coupling agent to be used for the surface treatment are not limited to particular range.

Examples of the curing promoter (D) include phosphorous compounds such as triphenylphosphine, tributylphosphine, tri(p-methylphenyl)phosphine, tri(nonylphenyl)phosphine, triphenylphosphine/triphenylborane, tetraphenylphosphine/tetraphenylborate, and an adduct of triphenylphosphine with p-benzoquinone; tertiary amine compounds such as triethylamine, benzyldimethylamine, α-methylbenzyldimethylamine, 1,8-diazabicyclo (5.4.0)undecene-7; and imidazol compounds such as 2-ethyl-4-methyl imidazol, 2-methyl imidazol, 2-phenyl imidazol, and 2-phenyl-4-methyl imidazol. Preferably, phosphorous compounds such as triphenylphosphine, tributylphosphine, tri(p-methylphenyl)phosphine, tri (nonylphenyl)phosphine, triphenylphosphine/triphenylborane, tetraphenylphosphine/tetraphenylborate, and an adduct of triphenylphosphine with p-benzoquinone are used.

The curing promoter (D) is contained in the composition in an amount enough to promote curing. Typically, the curing promoter (D) is contained in an amount of from 0.1 to 5 parts by weight, particularly from 0.5 to 2 parts by weight, per total 100 parts by weight of the components (A) and (B).

The present composition can contain various kinds of additives in an amount not to adversely affect the composition. Examples of the additives include waxes such as carnauba wax, oxidized polyethylene, and montanic acid esters, colorant such as carbon black, flame retardants such as zinc molybdate deposited on talc, zinc molybdate deposited on zinc, phosphazene compounds and silicone compounds, halogen trapping agents such as hydrotalcite compounds and rare earth oxides.

The present composition can be prepared by thoroughly mixing the epoxy resin (A), the curing agent (B), the inorganic filler (C), the curing promoter (D), and optional additives with a mixing means such as a mixer, followed by melt-mixing the mixture with a heated roll, kneader, or extruder, and then solidifying the molten mixture by cooling. The composition obtained may be pulverized as desired.

The composition is suitable as the encapsulating resin of the semiconductor device of the present invention. The encapsulation is generally performed by a low-pressure transfer molding, preferably at a temperature of from 150 to 185° C. for 30 to 180 seconds. Post curing at a temperature of from 150 to 185° C. for 2 to 20 hours is preferably performed.

EXAMPLES

The present invention will be explained with reference to the examples but not limited thereto. In the following description, the term "parts" means parts by weight, unless otherwise specified.

Composition Examples 1-5 and Comparative Composition Examples 1-4

Epoxy resin compositions for encapsulating a semiconductor device were prepared by mixing the components in amounts as shown in parts by weight in Table 1, and then melt-mixing the mixture with a double roller mill with one roller heated at 60° C. and the other one at 90° C. The molten mixture was cooled and then pulverized.

TABLE 1

| Composition | | Examples | | | | | Comparative Examples | | | |
|---|---|---|---|---|---|---|---|---|---|---|
| parts by weight | | 1 | 2 | 3 | 4 | 5 | 1 | 2 | 3 | 4 |
| (A) Epoxy resin | (A)-a | 65 | 65 | 54 | 54 | | 65 | 65 | 65 | |
| | (A)-b | | | | | 61 | | | | 61 |
| (B) Curing agent | (B)-a | 35 | 35 | | | | 35 | 35 | 35 | |
| | (B)-b | | | 47 | 47 | 40 | | | | 40 |
| (C2) Inorganic filler | (C)-a | 400 | 350 | 450 | 450 | 350 | 450 | 400 | 300 | 800 |
| (C1) Inorganic filler | (C)-b | 50 | 350 | 100 | | 350 | | | 400 | |
| | (C)-c | | | | 100 | | | | | |
| (D) Curing promoter | | 1 | 1 | 1 | 1 | 1 | 1 | 1 | 1 | 1 |
| Releasing agent | | 1 | 1 | 1 | 1 | 1 | 1 | 1 | 1 | 1 |
| Silane coupling agent | | 1 | 1 | 1 | 1 | 1 | 1 | 1 | 1 | 1 |
| Colorant | | 1 | 1 | 1 | 1 | 1 | 1 | 1 | 1 | 1 |
| Specific gravity of cured composition, g/cm$^3$ | | 1.96 | 2.00 | 1.98 | 2.07 | 2.00 | 1.95 | 1.94 | 2.01 | 2.00 |
| Total volume of C1 and C2/Volume of cured composition, % | | 71.8 | 76.5 | 74.6 | 64.6 | 76.4 | 72.0 | 70.0 | 76.5 | 80.4 |
| volume of C1/Volume of cured composition, % | | 7.5 | 36.9 | 12.8 | 11.9 | 36.8 | 0.0 | 0.0 | 42.4 | 0.0 |
| Total weight of C1 and C2/weight of cured composition, wt % | | 81 | 87 | 84 | 84 | 87 | 81 | 79 | 87 | 88 |
| weight of C1/weight of cured composition, wt % | | 9 | 44 | 15 | 15 | 43 | 0 | 0 | 50 | 0 |

The materials used as the components shown in Table 1 are as follows.
(A) Epoxy resin
(A)-a: o-cresol epoxy resin, EOCN-1020-55, ex Nippon Kayaku Co.Ltd.
(A)-b: bipheny group containing phenol aralkyl epoxy resin, NC-3000, ex Nippon Kayaku Co.Ltd.
(B) Curing agent
(B)-a: Novolac type phenolic resin, H-4, ex Meiwa Plastic Industries, Ltd.
(B)-b: Phenol aralkyl type phenolic resin, MEH-7800SS, ex Meiwa Plastic Industries, Ltd.
(C) Inorganic filler
(C)-a: spherical fused silica, MSR-25, ex Tatsumori, Ltd., having an average thermal expansion coefficient of $0.05 \times 10^{-5}$/° C. at a temperature from 40 to 400° C. and a specific gravity of 2.25 g/cm$^3$ at 25° C.
(C)-b: spherical cristobalite, MSR-2500(C), ex Tatsumori, Ltd., having an average thermal expansion coefficient of $2.0 \times 10^{-5}$/° C. at a temperature from 40 to 400° C. and a specific gravity of 2.36 g/cm$^3$ at 25° C.
(C)-c: crystal silica, Crystalite 3K, ex Tatsumori, Ltd., having an average thermal expansion coefficient of $1.5 \times 10^{-5}$/° C. at a temperature from 40 to 400° C. and a specific gravity of 2.65 g/cm$^3$ at 25° C.
(D) Curing promoter: triphenyl phosphine: TPP, ex Hokko Chemical Industry Co.Ltd. Releasing agent: Carnauba wax, Nikko Fine Products Co.Ltd. Silane coupling agent: KBM-403, γ-glycidoxymethoxysilane, Shin-Etsu Chemical Co.Ltd. Colorant: Carbon black, Denka black, ex Denki Kagaku Kogyo Kabushiki Kaisha.

The following properties were measured for each composition. Results are as shown in Table 3.

Spiral Flow

Spiral flow was measured at a temperature of 175° C. and a pressured of 6.9N/mm$^2$ using a metal mold according to EMMI standard.

Thermal Expansion Coefficient of Cured Composition

Using a metal mold according to EMMI standard, 5×5×15 mm test pieces were prepared in injection molding conditions of a temperature of 175° C., a pressure of 6.9 N/mm$^2$, and a time of 120 sec. At room temperature, a length of a test piece (L mm) was measured to an accuracy of 0.01 mm with a micrometer. Thermal expansion coefficient of the test piece was determined with a thermal dilatometer under a load of 19.6 mN at a temperature rise rate of 5° C./min to 300° C. A length vs. temperature graph was plotted and two tangent lines were drawn at a temperature range above and below the glass transition temperature, respectively. Lengths of the test piece at two arbitrary temperatures A1 (° C.) and A2 (° C.) on the tangent line below the glass transition temperature, two arbitrary temperatures B1 (° C.) and B2 (° C.) on the tangent line above the glass transition temperature, 250° C. and 280° C. were read, and thermal expansion coefficients were calculated according to the following equations:

Thermal expansion coefficient at the glass transition temperature or lower:

(Length at A2−Length at A1)/((A2−A1)×(L×10$^3$))

Thermal expansion coefficient at a temperature above the glass transition temperature:

(Length at B2−Length at B1)/((B2−B1)×(L×10$^3$))

Thermal expansion coefficient at a temperature from 250° C. to 280° C.:

(Length at 280° C.−Length at 250° C.)/(30×(L))

Preparation of a Semiconductor Device and Measurement of Warpage

A semiconductor device having a cross sectional view like the one shown in FIG. 1 and sizes as shown in Table 2 was prepared in the molding conditions of a temperature of 175° C., a pressure of 6.9 N/mm$^2$, and a time of 120 sec. In FIG. 1, there are depicted three semiconductor chips, but actual numbers of chips are as shown in Table 2. After cooling the encapsulated device, an amount of warpage was measured with a laser three-dimensional measuring instrument as a distance between an imaginary line connecting two diagonally opposite corners of the substrate and a highest or lowest position on the topside of the substrate between the two corners. In Table 3, a positive warpage represents a convex warpage and a negative warpage represents a concave warpage.

In the semiconductor device, the following substrate and die bonding agent were used.

Die bonding agent: Able 6202C, ex Nippon Ablestick Co., having a glass transition temperature of 40° C., a thermal expansion coefficient at the glass transition temperature or lower of $7.0 \times 10^{-5}$/° C. and a thermal expansion coefficient at a temperature above the glass transition temperature of $35.0 \times 10^{-5}$/° C., and a thickness after cured of 50 μm.

Organic substrate: CCL-HL-832, ex Mitsubishi Gas Chemical Co., having a glass transition temperature of 180° C., a thermal expansion coefficient at the glass transition temperature or lower of $1.5\times10^{-5}/°$ C. and a thermal expansion coefficient at a temperature above the glass transition temperature of $1.1\times10^{-5}/°$ C.

TABLE 2

|  | Device 1 | Device 2 | Device 3 | Device 4 | Device 5 |
|---|---|---|---|---|---|
| Number of semiconductor chip (N) | 12 | 16 | 25 | 16 | 25 |
| Total volume of semiconductor chips F × G × H × N(mm³) | 194.4 | 259.2 | 405 | 405 | 405 |
| Volume of device J × K × L(mm³) | 1250 | 1250 | 1250 | 1000 | 750 |
| (Total volume of semiconductor chips)/ (Volume of device) (%) | 16 | 21 | 32 | 41 | 54 |

In Table 2, F, G, H, J, K and L are sizes as indicated in FIG. 2.

Reflow Resistance

Figure 3:
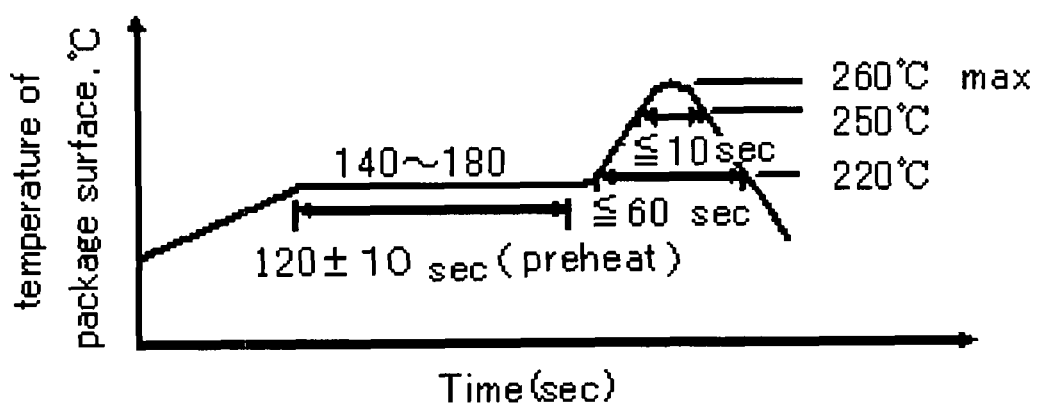
FIG. 3 is a temperature profile of the infrared (IR) reflow furnace used in the Examples.

The semiconductor device 2, after warpage measurement, was segmented per chip, and the segments were placed in a thermo-hygrostat kept at a temperature of 85° C. and a relative humidity of 60% for 168 hours. Then, the segments were passed three times through an IR reflow furnace with temperature profile as shown in FIG. 3. Subsequently, the segments were observed with an ultrasonic inspection instrument and a number of segments was counted in which cracks or peeling-off was detected.

TABLE 3

| Test Item | Unit | Examples | | | | | Comparative Examples | | | |
|---|---|---|---|---|---|---|---|---|---|---|
|  |  | 1 | 2 | 3 | 4 | 5 | 1 | 2 | 3 | 4 |
| Spiral flow | cm | 120 | 100 | 120 | 90 | 130 | 120 | 140 | 100 | 100 |
| Thermal expansion coefficient (≦Tg) | $10^{-5}/°$ C. | 1.4 | 1.8 | 1.5 | 1.4 | 1.7 | 1.3 | 1.4 | 1.9 | 1.0 |
| Thermal expansion coefficient (>Tg) | $10^{-5}/°$ C. | 4.8 | 6.8 | 4.8 | 4.2 | 6.2 | 4.0 | 4.3 | 8.5 | 3.5 |
| Thermal expansion coefficient (250° C.-280° C.) | $10^{-5}/°$ C. | 7.2 | 31.3 | 11.4 | 4.3 | 30.5 | 4.2 | 4.5 | 38.5 | 3.6 |
| Warpage in device 2 | μm | −150 | −450 | −250 | 0 | −240 | 200 | 20 | −600 | 400 |
| Warpage in device 3 | μm | 220 | −80 | 180 | 340 | 200 | 600 | 510 | −200 | 920 |
| Warpage in device 4 | μm | 320 | 210 | 380 | 490 | 470 | 880 | 850 | 50 | 1600 |
| Warpage in device 1 | μm | −480 | −850 | −630 | −400 | −740 | −200 | −440 | −1000 | −120 |
| Warpage in device 5 | μm | 810 | 650 | 950 | 1100 | 900 | 1400 | 1600 | 420 | 1800 |
| Averaged warpage | μm | 144 | −104 | 126 | 306 | 118 | 576 | 508 | −266 | 920 |
| Reflow resistance |  | 0/16 | 0/16 | 0/16 | 0/16 | 0/16 | 0/16 | 5/16 | 11/16 | 0/16 |

As can be found from Table 3, the semiconductor devices 1 and 5 had volume ratios of the semiconductor chip to the semiconductor device outside the range of from 18 to 50% and showed larger warpage. Compositions of Comparative Examples 1, 2, and 4 did not contain inorganic filler C1, and the composition of Comparative Example 3 contained C1 more than 45%. The semiconductor devices prepared from these comparative compositions showed absolute value of warpage larger than 600 μm. On the other hand, the semiconductor of the present invention showed warpage smaller than +/−600 μm and excellent reflow resistance.

Quantitative Analysis of the Filler

A piece of the cured resin scraped from the semiconductor device 2 was precisely weighed in an aluminum crucible and burned in the air in an muffle furnace kept at 600° C. for 8 hours. A residue on burning was determined to be 81% which agreed well with the amount fed.

INDUSTRIAL APPLICABILITY

The semiconductor device of the present invention is little warped and resistant to reflow process. Therefore, it is suitable for use in various electronic appliances. The composition of the present invention is suitable for preparing the semiconductor device, particularly a thin BGA package.

The invention claimed is:

1. A semiconductor device comprising an organic substrate, at least one semiconductor chip provided on a surface of the substrate, and a cured resin composition encapsulating the semiconductor chip provided on the surface of the substrate, wherein
   the organic substrate has at least one groove which is filled with the cured resin composition, the semiconductor chip is connected to the organic substrate with a bonding wire which extends through the groove; and the bonding wire is encapsulated with the cured resin composition,
   an absolute value of a distance between an imaginary line connecting two diagonally opposite corners of the substrate and a highest or lowest position on the surface of the substrate between the corners is smaller than 600 μm, as measured with a laser three-dimensional measuring instrument,
   a total volume ratio of the semiconductor chip to the semiconductor device ranges from 18 to 50%, and
   the cured resin composition comprises an inorganic filler (C) comprising
   (C1) at least one inorganic filler having an average thermal expansion coefficient of from $1.0\times10^{-5}/°$ C. to $3.0\times10^{-5}/°$ C. at a temperature of from 40 to 400° C. and
   (C2) at least one inorganic filler having an average thermal expansion coefficient smaller than $1.0\times10^{-5}/°$ C. at a temperature of from 40 to 400° C.,
   a weight ratio of the inorganic filler (C) to a total weight of the cured resin composition ranges from 80 to 90%, and
   a weight ratio of the inorganic filler (C1) to the cured resin composition ranges from 5 to 45%.

2. The semiconductor device according to claim 1, wherein the total volume ratio of the semiconductor chip to the semiconductor device ranges from 20 to 45%.

3. The semiconductor device according to claim 1, wherein the absolute value of the distance is 500 μm or smaller.

4. The semiconductor device according to claim 1, wherein the inorganic filler (C) comprises at least one spherical filler.

5. The semiconductor device according to claim 1, wherein the inorganic filler (C) comprises at least one filler composed of silicon dioxide.

6. The semiconductor device according to claim 1, wherein the organic substrate comprises a bismaleimide triazine resin.

7. The semiconductor device according to claim 1, wherein the cured resin composition comprises:
- an epoxy resin (A);
- a curing agent (B) having an epoxy-reactive group in such an amount that a molar ratio of the epoxy-reactive group to the epoxy group of the component (A) ranges from 0.5 to 1.5;
- said inorganic filler (C); and
- a curing promoter (D).

8. The semiconductor device according to claim 7, wherein the curing agent (B) is a phenolic resin.

9. The semiconductor device according to claim 1, wherein the inorganic filler (C1) is cristobalite.

10. The semiconductor device according to claim 1, wherein the inorganic filler (C1) is spherical.

11. The semiconductor device according to claim 1, wherein the inorganic filler (C2) is fused silica.

12. The semiconductor device according to claim 1, wherein the inorganic filler (C2) is spherical.

* * * * *